United States Patent
Wu et al.

(10) Patent No.: US 10,756,019 B1
(45) Date of Patent: Aug. 25, 2020

(54) SYSTEMS PROVIDING INTERPOSER STRUCTURES

(71) Applicant: Xilinx, Inc., San Jose, CA (US)

(72) Inventors: Shuxian Wu, Saratoga, CA (US);
Xiaobao Wang, Cupertino, CA (US);
Xuemei Xi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/201,663

(22) Filed: Nov. 27, 2018

(51) Int. Cl.
*H01L 23/538* (2006.01)
*H01L 23/00* (2006.01)
*H01L 25/18* (2006.01)
*H01L 25/04* (2014.01)

(52) U.S. Cl.
CPC ...... *H01L 23/5386* (2013.01); *H01L 23/5381* (2013.01); *H01L 23/5383* (2013.01); *H01L 24/16* (2013.01); *H01L 24/24* (2013.01); *H01L 24/25* (2013.01); *H01L 25/042* (2013.01); *H01L 25/18* (2013.01); *H01L 24/73* (2013.01); *H01L 2224/16227* (2013.01); *H01L 2224/24137* (2013.01); *H01L 2224/73209* (2013.01); *H01L 2924/1431* (2013.01); *H01L 2924/1434* (2013.01); *H01L 2924/1436* (2013.01)

(58) Field of Classification Search
CPC .. H01L 23/538; H01L 25/042; H01L 23/5386
USPC ........................................................ 257/737
See application file for complete search history.

(56) References Cited

U.S. PATENT DOCUMENTS

| | | | | |
|---|---|---|---|---|
| 6,246,112 B1 * | 6/2001 | Ball | .................. | H01L 23/49822 257/690 |
| 2014/0042612 A1 * | 2/2014 | Liu | ...................... | H01L 23/5226 257/734 |
| 2014/0117552 A1 * | 5/2014 | Qian | ................... | H01L 23/5381 257/762 |
| 2016/0085899 A1 * | 3/2016 | Qian | ................... | G06F 17/5077 257/774 |
| 2018/0374804 A1 * | 12/2018 | Zhang | ................ | H01L 21/4857 |

* cited by examiner

*Primary Examiner* — David Vu
*Assistant Examiner* — Brandon C Fox
(74) *Attorney, Agent, or Firm* — Haynes and Boone, LLP

(57) ABSTRACT

A die-to-die interconnect structure includes an interconnect network including a plurality of metal interconnect layers. The interconnect network is configured to electrically couple a first die and a second die mounted on a top surface of the die-to-die interconnect structure. A first metal interconnect layer of the plurality of metal interconnect layers includes a plurality of ground lines and a plurality of signal lines distributed across the first metal interconnect layer according to a GSSG pattern. In some examples, adjacent signal lines within the first metal interconnect layer are separated by a dielectric region. In some embodiments, a second metal interconnect layer of the plurality of metal interconnect layers is disposed above the first metal interconnect layer and includes a plurality of configurable signal/ground lines. By way of example, each of the plurality of configurable signal/ground lines is disposed over the dielectric region and within the second metal interconnect layer.

20 Claims, 8 Drawing Sheets

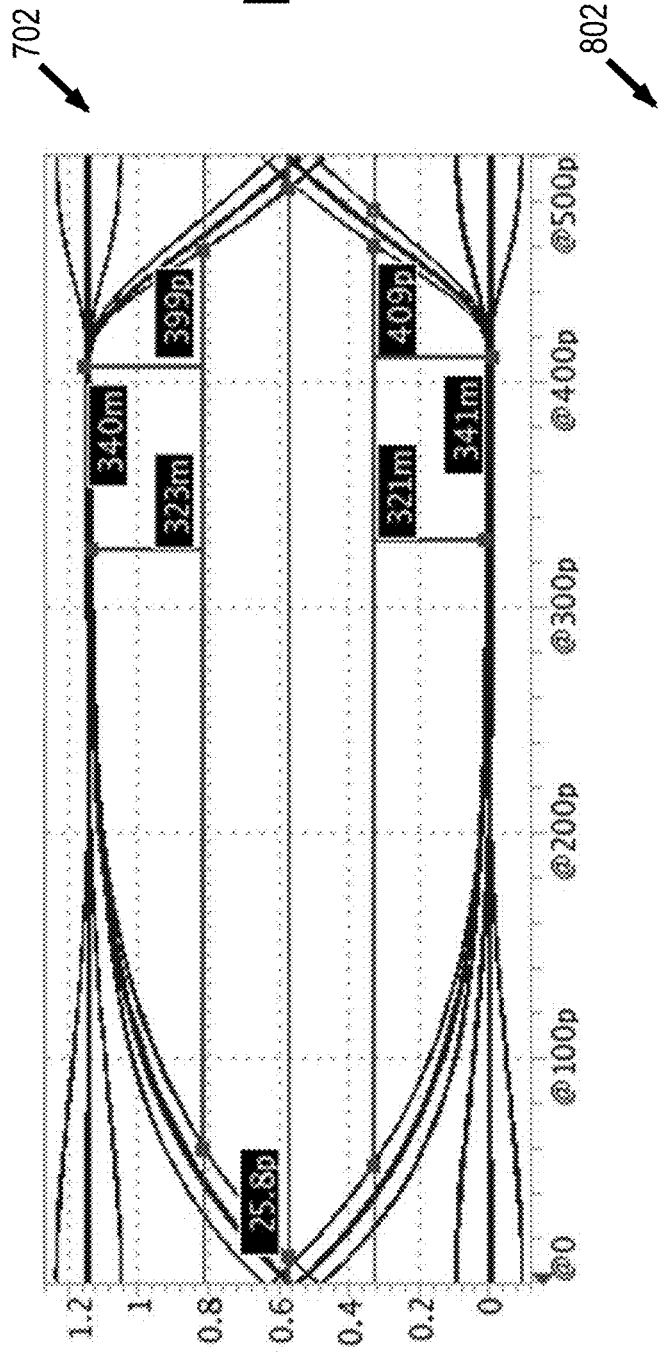

SYSTEMS PROVIDING INTERPOSER STRUCTURES

TECHNICAL FIELD

Examples of the present disclosure generally relate to integrated circuits (ICs) and, in particular, to an embodiment related to systems providing interposer structures.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling alone is not sufficient to provide the logic capacity and on-chip resources required to meet industry demands.

To address this limitation, 3D integrated circuits (3D ICs) have been introduced. 3D ICs offer improved performance (e.g., increased logic capacity, more internal memory, reduced latency, etc.) as well as heterogeneous functionality (e.g., logic, memory, etc.) in a reduced form factor. In some 3D IC examples, passive silicon interposers (e.g., with microbumps and through-silicon vias) are used to combine multiple die in a single package. As such, die of different types and/or die manufactured using different silicon processes may be interconnected on the interposer. In particular, to meet the high density routing needs of the multiple interconnected die, the interposer may be designed using metal interconnect layers having a high-density and fine metal pitch to complete all the required signal routing. Further, to meet the increasing memory bandwidth demand, high-bandwidth memory (HBM) has been introduced for use in 3D ICs. However, the integration of HBM with 3D ICs has been a challenge at least because of the high HBM RC delays associated with the high-density, fine metal pitch interconnect layers of the interposer. Increasing the size of the interposer interconnect layers (e.g., line width) may reduce resistance, but doing so would also increase intermetal capacitance and would require a larger metal pitch, which cannot be used to meet both high-speed (e.g., for HBM) and high-density (e.g., as in FPGAs and SOCs) interconnect requirements.

Accordingly, there is a need for improved systems providing interposer structures.

SUMMARY

In some embodiments in accordance with the present disclosure, a die-to-die interconnect structure includes an interconnect network including a plurality of metal interconnect layers, where the interconnect network is configured to electrically couple a first die and a second die mounted on a top surface of the die-to-die interconnect structure. In some embodiments, a first metal interconnect layer of the plurality of metal interconnect layers includes a first plurality of ground lines and a first plurality of signal lines, where the first plurality of ground and signal lines are distributed across the first metal interconnect layer according to a first pattern, and where adjacent signal lines within the first metal interconnect layer are separated by a first dielectric region. In some embodiments, a second metal interconnect layer of the plurality of metal interconnect layers is disposed above the first metal interconnect layer and includes a plurality of configurable signal/ground lines, where each of the plurality of configurable signal/ground lines is disposed over the first dielectric region.

In some embodiments, a third metal interconnect layer of the plurality of metal interconnect layers includes a second plurality of ground lines and a second plurality of signal lines, where the second plurality of ground and signal lines are distributed across the third metal interconnect layer according to the first pattern, and where adjacent signal lines within the third metal interconnect layer are separated by a second dielectric region.

In some embodiments, the second metal interconnect layer of the plurality of metal interconnect layers is disposed below the third metal interconnect layer, and each of the plurality of configurable signal/ground lines is disposed beneath the second dielectric region.

In some embodiments, each signal line of the first plurality of signal lines of the first metal interconnect layer is substantially vertically aligned with respective ones of each signal line of the second plurality of signal lines of the third metal interconnect layer.

In some embodiments, each signal line of the first plurality of signal lines of the first metal interconnect layer is separated from respective ones of each signal line of the second plurality of signal lines of the third metal interconnect layer by a third dielectric region.

In some embodiments, at least a portion of the third dielectric region is disposed within the second metal interconnect layer.

In some embodiments, the first pattern includes a ground-signal-signal-ground (G-S-S-G) pattern.

In some embodiments, each signal line of the first plurality of signal lines has a signal line width equal to about 2 microns, and adjacent signal lines within the first metal interconnect layer are separated by a signal line spacing equal to about 3 microns.

In some embodiments, the second metal interconnect layer of the plurality of metal interconnect layers further includes a third plurality of ground lines, where each of the third plurality of ground lines is disposed directly between a respective first ground line of the first plurality of ground lines and a respective second ground line of the second plurality of ground lines.

In some embodiments, each of the third plurality of ground lines is coupled to the respective first ground line of the first plurality of ground lines using a first VIA, and each of the third plurality of ground lines is coupled to the respective second ground line of the second plurality of ground lines using a second VIA to form a plurality of stacked ground-VIA chains. In some embodiments, each of the plurality of configurable signal/ground lines is disposed between adjacent stacked ground-VIA chains.

In some embodiments, the die-to-die interconnect structure includes a passive silicon interposer or an embedded multi-die interconnect bridge (EMIB).

In some embodiments, the first die includes a field programmable gate array (FPGA) die or a system-on-a-chip (SoC) die, and the second die includes a high-bandwidth memory (HBM).

In some embodiments in accordance with the present disclosure, a heterogeneous device includes a die-to-die interconnect structure including an interconnect network having a plurality of metal interconnect layers, and a first die and a second die coupled to a plurality of microbumps disposed on a top surface of the die-to-die interconnect structure, where the plurality of microbumps electrically couple to the interconnect network to provide a connection between the first die and the second die. In some embodiments, a first metal interconnect layer of the plurality of metal interconnect layers includes a first plurality of ground lines and a first plurality of signal lines distributed across the first metal interconnect layer according to a ground-signal-signal-ground (G-S-S-G) pattern, and adjacent signal lines within the first metal interconnect layer are separated by a first non-conductive region. In some embodiments, a second metal interconnect layer of the plurality of metal interconnect layers is disposed above the first metal interconnect layer and includes a plurality of configurable signal/ground lines, where each of the plurality of configurable signal/ground lines is disposed over the first non-conductive region.

In some embodiments, the die-to-die interconnect structure includes a passive silicon interposer or an embedded multi-die interconnect bridge (EMIB).

In some embodiments, the first die includes a field programmable gate array (FPGA) die or a system-on-a-chip (SoC) die, and the second die includes a high-bandwidth memory (HBM).

In some embodiments, a third metal interconnect layer of the plurality of metal interconnect layers includes a second plurality of ground lines and a second plurality of signal lines distributed across the third metal interconnect layer according to the G-S-S-G pattern, and adjacent signal lines within the third metal interconnect layer are separated by a second non-conductive region.

In some embodiments, the second metal interconnect layer of the plurality of metal interconnect layers is disposed below the third metal interconnect layer, and each of the plurality of configurable signal/ground lines is disposed beneath the second non-conductive region.

In some embodiments in accordance with the present disclosure, an interconnect structure configured to electrically couple a first die and a second die includes a first interconnect layer including a first plurality of ground lines and a first plurality of signal lines arranged in a ground-signal-signal-ground (G-S-S-G) pattern. In some embodiments, the interconnect structure further includes a third interconnect layer including a second plurality of ground lines and a second plurality of signal lines arranged in the G-S-S-G pattern. Further, in some embodiments, the interconnect structure includes a second interconnect layer disposed between the first and third interconnect layers, where the second interconnect layer includes a first plurality of dielectric regions, where each of the plurality of dielectric regions are substantially vertically aligned with, and electrically isolate, respective ones of the first plurality of signal lines and the second plurality of signal lines.

In some embodiments, adjacent signal lines within the first interconnect layer are separated by a second dielectric region, and adjacent signal lines within the third interconnect layer are separated by a third dielectric region.

In some embodiments, the second interconnect layer includes a configurable signal/ground line that is substantially vertically aligned with, and disposed between, the second dielectric region and the third dielectric region.

Other aspects and features will be evident from reading the following detailed description and accompanying drawings.

BRIEF DESCRIPTION OF THE DRAWINGS

FIG. 7, illustrates an eye diagram simulation for the modified interposer topology of FIG. 6, according to various embodiments.

FIG. 8 provides a table showing data extracted from the eye diagram simulation of FIG. 7, according to some embodiments, as well as data for an eye diagram simulation corresponding to a conventional interposer topology.

DETAILED DESCRIPTION

Figure 1:
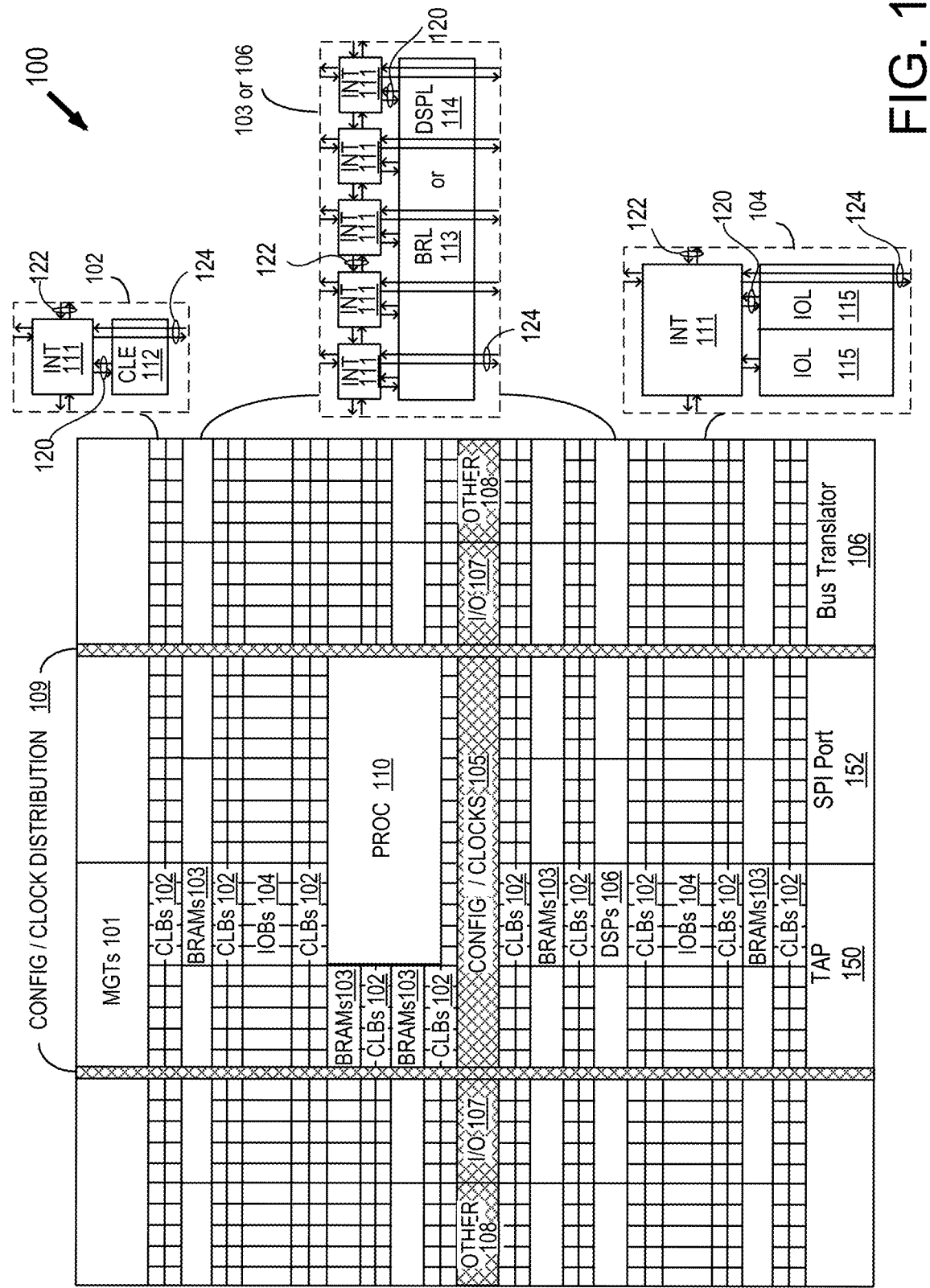
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, 3D ICs have been introduced to provide the logic capacity and on-chip resources required to meet industry demands, and which scaling alone cannot provide. 3D ICs may use passive silicon interposers (e.g., with microbumps and through-silicon vias) to combine multiple die in a single package and thus provide an integrated system-in-package (SiP). As such, die of different types and/or die manufactured using different silicon processes may be interconnected on the interposer. By providing the multiple interconnected die, resources and performance may be improved (e.g., by providing increased logic capacity, more internal memory, reduced latency, etc.) and heterogeneous functionality (e.g., logic, memory, etc.) may be provided, while maintaining a reduced form factor. In particular, to meet the high density routing needs of the multiple interconnected die, the interposer may be designed using metal interconnect layers having a high-density and fine metal pitch to complete all the required signal routing. Further, to meet the increasing memory bandwidth demand, high-bandwidth memory (HBM) has been introduced for use in 3D ICs. However, the integration of HBM with 3D ICs has been a challenge at least because of the high HBM RC delays associated with the high-density, fine metal pitch interconnect layers of the interposer. Increasing the size of the interposer interconnect layers (e.g., line width) may reduce resistance, but doing so would also increase inter-metal capacitance and would require a larger metal pitch, which cannot be used to meet both high-speed (e.g., for HBM) and high-density (e.g., as in FPGAs and SOCs) interconnect requirements. For integrated circuit (IC) solutions, it has been discovered that an interposer, having a modified interposer topology as compared to various existing designs, may be employed to address this need and provide for the heterogeneous integration of HBM with FPGAs and/or SOCs.

With the above general understanding borne in mind, various embodiments for providing an interposer are generally described below. Various advantages may be present in various applications of the present disclosure. No particular advantage is required for all embodiments, and different embodiments may offer different advantages. For example, embodiments discussed herein include systems providing an interposer suitable for the heterogeneous integration of high-speed (e.g., HBM) and high-density (e.g., FPGAs and/or SOCs) components, without the drawbacks of at least some current solutions, as noted above. In particular, by optimizing the interposer topology including the metal planning/routing/sizing (e.g., of the interposer metal interconnect layers) of signal and ground/power interconnect lines, and by creating virtual dielectric gaps between signal lines, it is possible to reduce resistance (R) and capacitance (C) simultaneously to meet both high-speed (e.g., HBM) and high-density (e.g., FPGAs and/or SOCs) interconnect requirements.

In some embodiments, an interposer may include a plurality of metal interconnect layers, such as three (M1, M2, M3), four (M1, M2, M3, M4), five (M1, M2, M3, M4, M5), or more metal interconnect layers. By way of illustration and considering an example of an interposer including three metal interconnect layers (M1, M2, M3), M1 and M3 may be used as signal routing layers, where adjacent interconnect lines within a given M1/M3 layer follow a repeated pattern of ground-signal-signal-ground (G-S-S-G). M2, which is disposed between M1 and M3, may include signal or ground lines that interleave M1/M3 signal lines to provide an "empty" space (i.e., a region without an interconnect line but including a dielectric layer) between the M1 and M3 signal lines, and within the M2 layer, to create a virtual dielectric gap that has a high inter-metal dielectric thickness and provides for reduced capacitance. As a further result, the M2 signal or ground lines may be disposed over an M1 empty space and beneath an M3 empty space, where as noted above the empty spaces include regions without an interconnect line but including a dielectric layer. In various examples, the line width of the M1/M3 signal lines may be increased (e.g., as compared to conventional designs) to reduce resistance, but by providing the empty spaces over/beneath the M1 and M3 signal lines that effectively provide a high inter-metal dielectric thickness, capacitance (and thus RC delay) is also reduced. In addition, and in some embodiments, at least some of the M2 ground lines may be disposed directly between M1 and M3 ground lines, where the M1, M2, and M3 ground lines are connected by VIAs to form stacked metal-VIA chains (GND-VIA chains) that provide a ground shield as a signal return path. Also, in some examples, the M2 signal or ground lines that are disposed over the M1 empty space and beneath the M3 empty space may further be disposed between neighboring GND-VIA chains. By the above arrangement, a GND mesh is provided within M2 with periodic perpendicular straps connecting M1 and M3 GND lines (e.g., the GND-VIA chains) to form an effective ground shield with low resistance. Additional embodiments and advantages are discussed below and/or will be evident to those skilled in the art in possession of this disclosure.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, for each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the ICs that may be interconnected by the disclosed interposer are not limited to the exemplary IC depicted in FIG. 1, and that ICs having other configurations, or other types of ICs (e.g., such as HBM ICs), may also be interconnected by the disclosed interposer.

Figure 2:
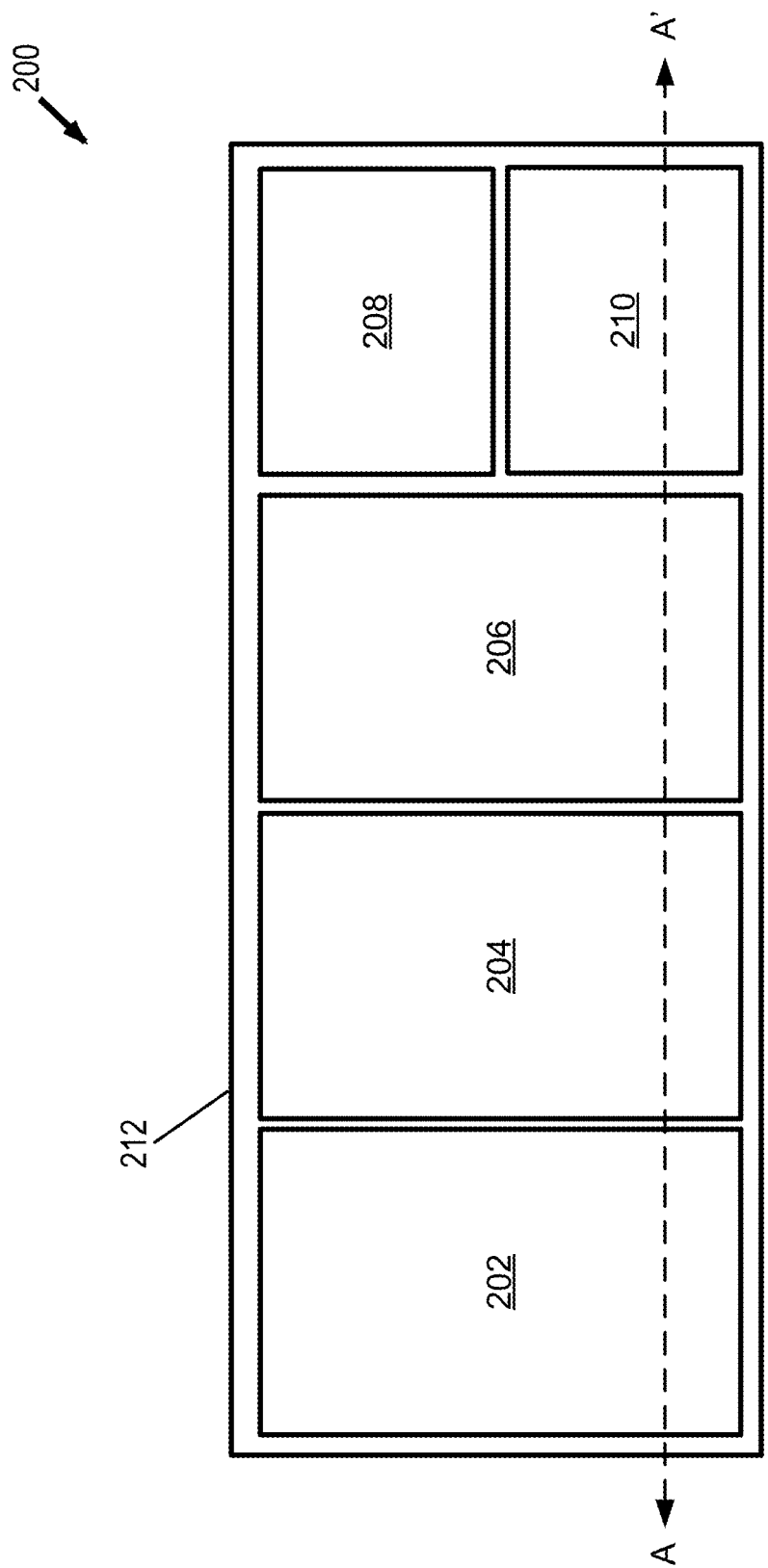
FIG. 2 is a top-down view of a device including a plurality of high-density blocks and high-speed blocks.

Reference is now made to the example of FIG. 2, which shows a top-down view of a device 200 including a plurality of high-density blocks 202, 204, 206 and high-speed blocks 208, 210. In various examples, the plurality of high-density blocks 202, 204, 206 and high-speed blocks 208, 210 are interconnected using an interposer 212, which is discussed in more detail below with reference to FIG. 3. In some embodiments, each of the high-density blocks 202, 204, 206 may include an FPGA or SoC die (e.g., such as the FPGA 100 of FIG. 1), and the high-speed blocks 208, 210 may include high bandwidth memory (HBM) blocks. By way of example, the HBM blocks generally include a 3D stack of memory die (e.g., DRAM), which are interconnected using microbumps and through-silicon vias. In addition, and in some embodiments, at least one of the high-density blocks 202, 204, 206 includes a memory controller (e.g., an HBM controller) to facilitate communication with the high-speed blocks 208, 210. Optionally, and in some cases, the HBM 3D stack may include a base die having the memory controller. The exemplary device 200, which combines different types of die having different functionality into a single device, may be referred to as a heterogeneous device. In addition, while the high-speed blocks 208, 210 have been described as including HBM blocks, it will be understood that different types of high-speed blocks may be used without departing from the scope of the present disclosure.

It is also noted that the die (e.g., FPGA or SoC die) used for the high-density blocks 202, 204, 206 and the die (e.g., DRAM die) used for the high-speed blocks 208, 210 may be formed on a silicon substrate and may include various doping configurations depending on design requirements. In addition, the substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features. In some examples, each of the high-density and/or high-speed die may further include various devices formed in or on the substrate such as active components including Field Effect Transistors (FETs), Bipolar Junction Transistors (BJTs), and diodes, passive components including resistors, capacitors, and transformers, or other suitable devices.

Figure 3:
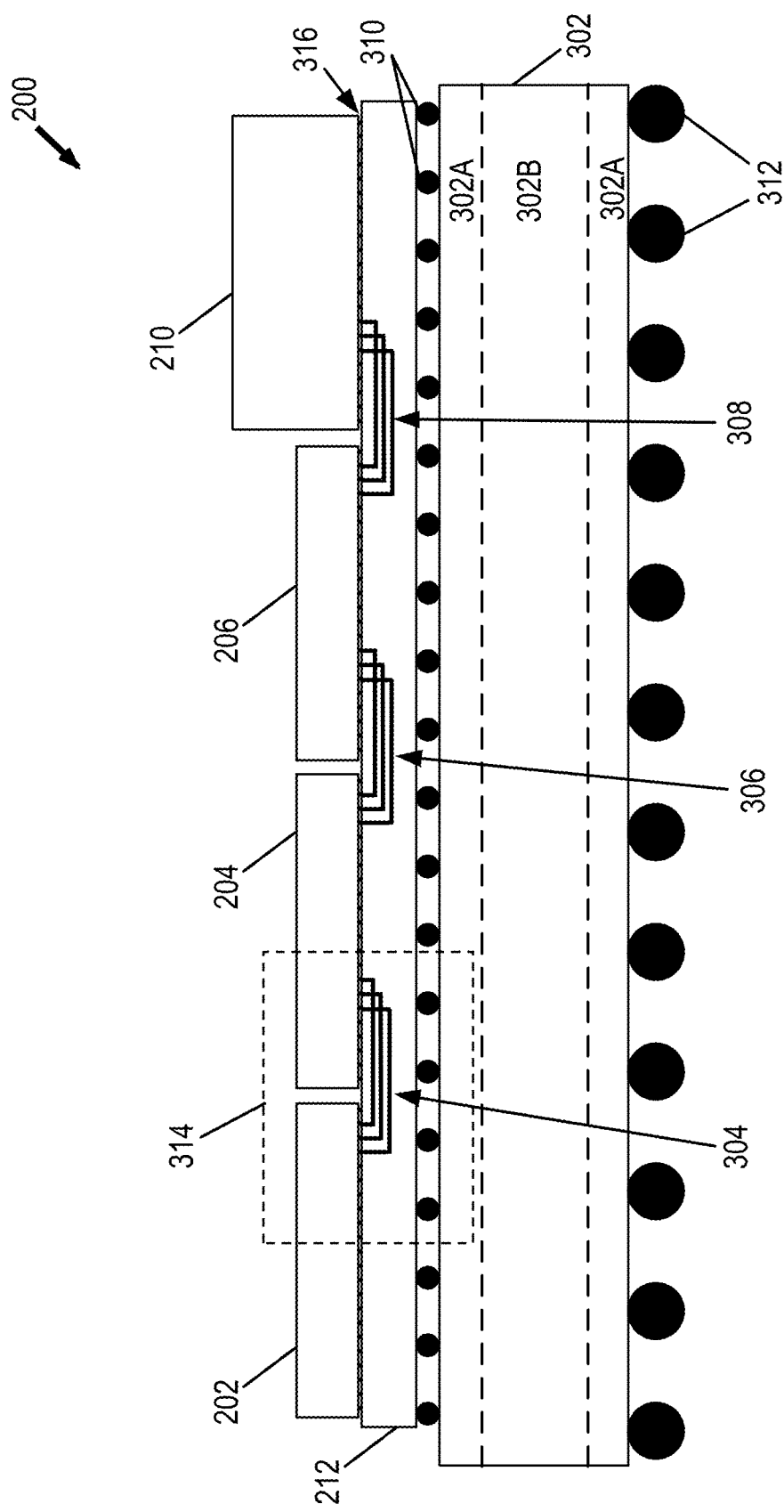
FIG. 3 is a cross-section view of the device of FIG. 2 taken substantially along section A-A' and further illustrating an interposer and a package substrate.

With reference to FIG. 3, illustrated therein is a cross-section view of the device 200 of FIG. 2 taken substantially along section A-A'. As shown, the high-density blocks 202, 204, 206 and the high-speed blocks 208, 210 (high-speed block 210 in this example) are disposed side-by-side on, and are interconnect through, the interposer 212 by way of interconnect networks 304, 306, 308. While illustrated as separate interconnect networks 304, 306, 308, in some embodiments the interposer 212 may include a single interconnect network distributed across the interposer 212. In some embodiments, the interposer 212 includes a passive silicon interposer with a plurality of microbumps 316 disposed on a top surface of the interposer 212, on which each of the high-density and high-speed die are mounted, and which electrically couple to the interconnect networks 304, 306, 308 to connect the high-density blocks 202, 204, 206 and the high-speed blocks 208, 210 to each other. In various examples, the interposer 212 may provide tens of thousands of die-to-die connections to provide an ultra-high interconnect bandwidth. Further, the interposer 212 is disposed on, and connected to, a package substrate 302 for example by way of a flip-chip assembly technique utilizing a plurality of controlled collapse chip connection (C4) bumps 310. In particular, the interposer 212 may include through-silicon vias (shown in FIG. 4) along a bottom portion of the interposer 212 that electrically couple the interconnect networks 304, 306, 308 to the C4 bumps 310. In some embodiments, the package substrate 302 may include build-up layers 302A and a core layer 302B that provide an electrical connection between the interposer 212 and an underlying circuit board upon which the package substrate 302 may be mounted by way of a plurality of ball grid array (BGA) solder balls 312. In other examples, the device 200 may employ an alternative type of surface mount technology, or other type of packaging technology. For purposes of illustration, the example of FIG. 3 may employ a stacked silicon interconnect (SSI) technology, where the interposer 212 is used to combine multiple die in a single package to provide improved performance (e.g., increased logic capacity, more internal memory, reduced latency, etc.) as well as heterogeneous functionality (e.g., logic, memory, etc.) in a reduced form factor.

Figure 4:
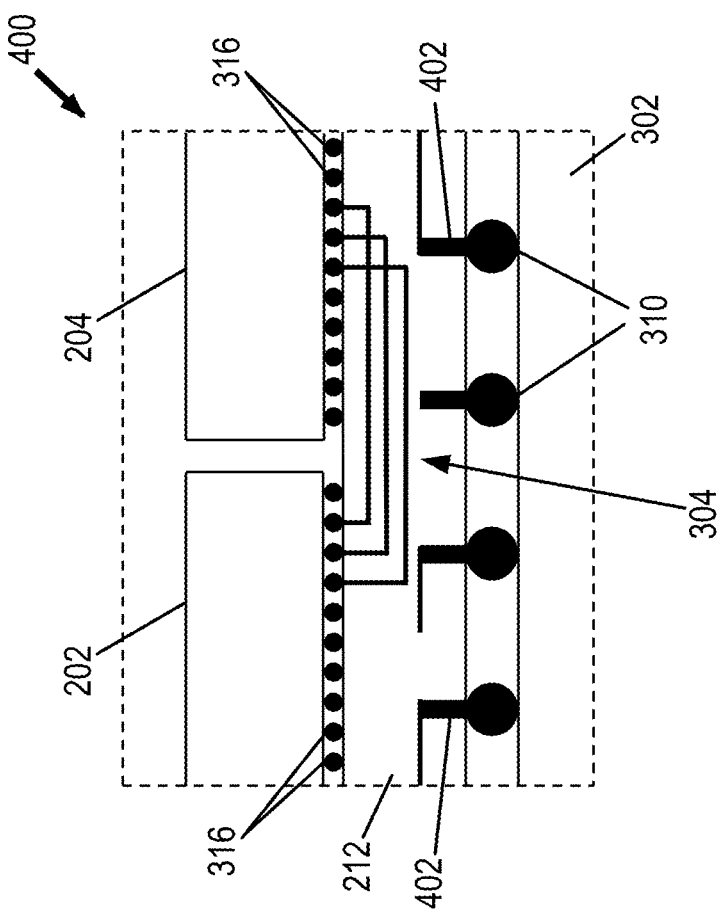
FIG. 4 is an enlarged view of a portion of the device of FIG. 3.

Referring now to FIG. 4, illustrated therein is an enlarged view of a portion 400 of the device 200 corresponding to the dashed outline 314 shown in FIG. 3. The portion 400 includes portions of the high-density blocks 202, 204, the interposer 212, the interconnect network 304, the package substrate 302, and the C4 bumps 310 used to couple the interposer 212 to the package substrate 302. In addition, the portion 400 illustrates the plurality of microbumps 316 and through-silicon vias (TSVs) 402. In various embodiments, the through-silicon vias 402 are disposed along a bottom portion of the interposer 212 and electrically couple the interconnect network 304 to the C4 bumps 310. As noted above, the plurality of microbumps 316 enables connection of the high-density blocks 202, 204, 206 and the high-speed blocks 208, 210 to one another. Generally, in various embodiments, the plurality of microbumps 316 may provide access to electrical power, ground, inputs and outputs (I/Os), and access to logic regions. As also noted, the interposer 212 includes one or more interconnect networks (e.g., the interconnect networks 304, 306, 308), and the one or more interconnect networks may include a plurality of metal interconnect layers, such as three (M1, M2, M3), four (M1, M2, M3, M4), five (M1, M2, M3, M4, M5), or more metal interconnect layers. By way of example, the one or more interconnect networks of the interposer 212 may electrically couple the plurality of microbumps 316 to the through-silicon vias 402, which in turn are coupled to the C4 bumps 310. In addition, and in some embodiments, the through-silicon vias 402 may provide access to electrical power, ground, and I/Os through the C4 bumps 310.

In various examples, the plurality of metal interconnect layers of the one or more interconnect networks may include metal lines formed of conductive materials such as aluminum, copper, aluminum-silicon-copper alloys, titanium, titanium nitride, tantalum, tantalum nitride, tungsten, polysilicon, other suitable conductive materials, or combinations thereof. In some embodiments, the one or more interconnect networks may further include inter-metal dielectric (IMD) layers to electrically isolate the plurality of metal interconnect layers from each other. By way of example, the IMD layers may include different dielectric materials such as low-k dielectric materials, silicon nitride, silicon oxynitride, spin-on glass (SOG), undoped silicate glass (USG), fluorinated silica glass (FSG), carbon doped silicon oxide (e.g., SiCOH), carbon-containing material, polyimide, other porous polymeric materials other suitable dielectric materials, and/or combinations thereof. In some embodiments, the IMD layers may also include metal vias connecting at least portions of some metal lines in different metal layers.

In various examples, the plurality of metal interconnect layers of the one or more interconnect networks (e.g., such as the interconnect networks 304, 306, 308) may be arranged or designed in accordance with a particular interposer topology. For purposes of this discussion, the term "interposer topology" may generally be used to describe the metal planning/routing/sizing of the plurality of metal interconnect layers of the one or more interconnect networks within an interposer (e.g., such as the interposer 212), where the plurality of metal interconnect layers may include at least signal interconnect lines and ground/power interconnect lines.

Figure 5:
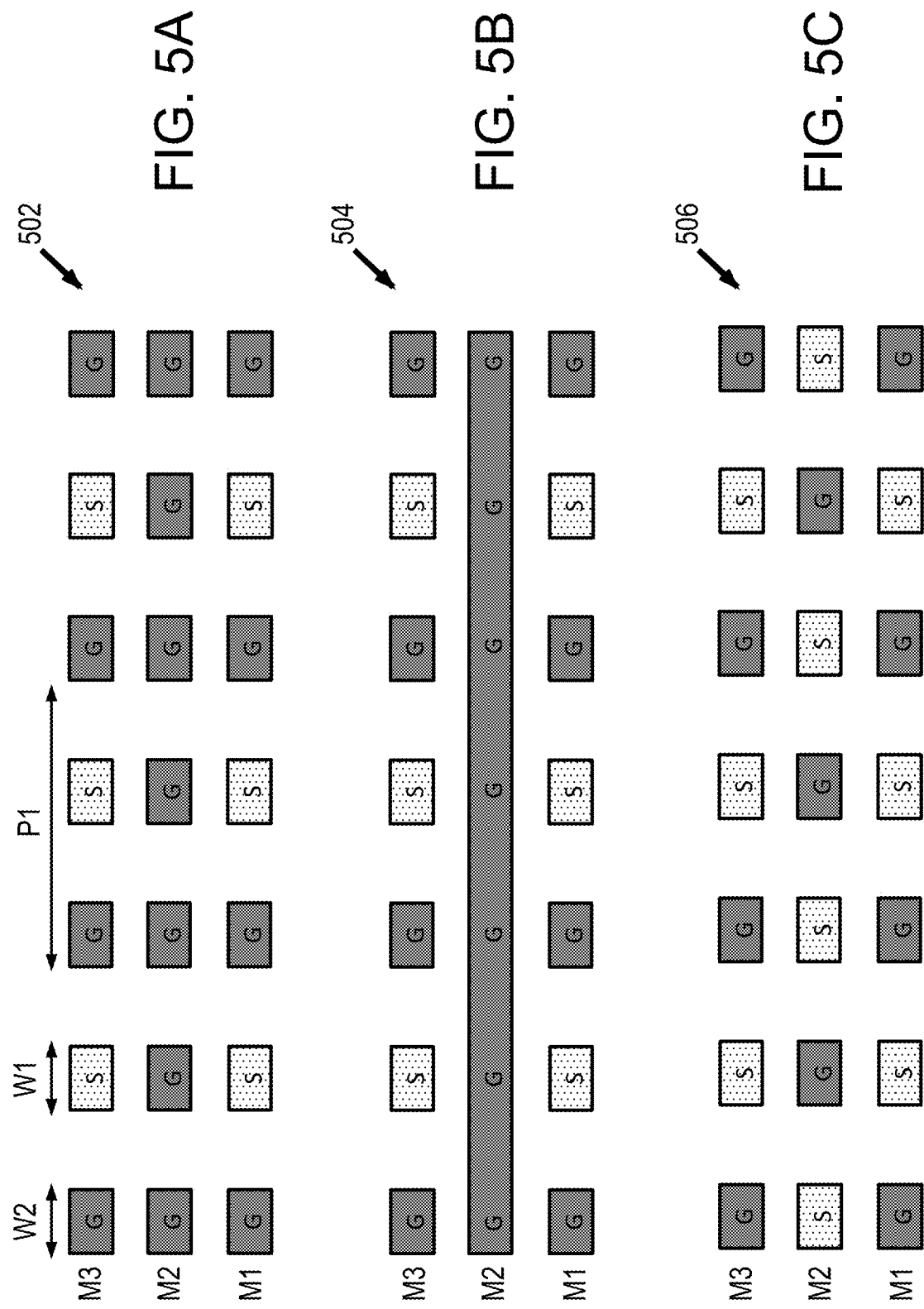
FIGS. 5A, 5B, and 5C illustrate exemplary conventional interposer topologies for interposer interconnect networks including three metal interconnect layers.

With this in mind, and with reference to FIGS. 5A, 5B, and 5C, illustrated therein are exemplary conventional interposer topologies 502, 504, 506 for interposer interconnect networks including three metal interconnect layers (M1, M2, M3). As shown, the M1 and M3 interconnect layers of each of the interposer topologies 502, 504, 506 include alternating ground 'G' and signal 'S' interconnect lines. The M2 interconnect layer for the interposer topology 502 includes all ground 'G' interconnect lines, the M2 interconnect layer for the interposer topology 504 includes a continuous ground 'G' plane, and the M2 interconnect layer for the interposer topology 506 includes alternating signal 'S' and ground 'G' interconnect lines. It is also noted that for each of the interposer topologies 502, 504, 506, all signal 'S' interconnect lines have another metal line (e.g., either signal 'S' or ground 'G') beneath and/or over the signal 'S' interconnect lines. This can lead to increased capacitance, cross-talk, and jitter. While not explicitly shown, it will be understood that one or more IMD layers may be used to electrically isolate the three metal interconnect layers (M1, M2, M3), as well as signal or ground lines within a given layer, from each other. In accordance with existing practice, each of the interposer topologies 502, 504, 506 is designed to have a high-density, fine metal pitch, and very tight design rules to accommodate all the required signal routing for high-density blocks (e.g., such as high-density blocks 202, 204, 206 that may include FPGA or SoC devices). However, as previously discussed, the integration of high-speed components (e.g., such as HBM) with high-density components (e.g., FPGAs and/or SOCs) has been a challenge at least because of the high HBM RC delays associated with the high-density, fine metal pitch interconnect layers found in conventional interposer topologies (e.g., such as the interposer topologies 502, 504, 506). By way of example, and with respect to conventional interposer topologies, increasing the size of the signal 'S' or ground 'G' interconnect lines (e.g., signal or ground line widths, W1 and W2) may reduce resistance, but doing so would also increase inter-metal capacitance and would require a larger metal pitch (P1), which cannot be used to meet both high-speed (e.g., for HBM) and high-density (e.g., as in FPGAs and SOCs) interconnect requirements.

Figure 6:
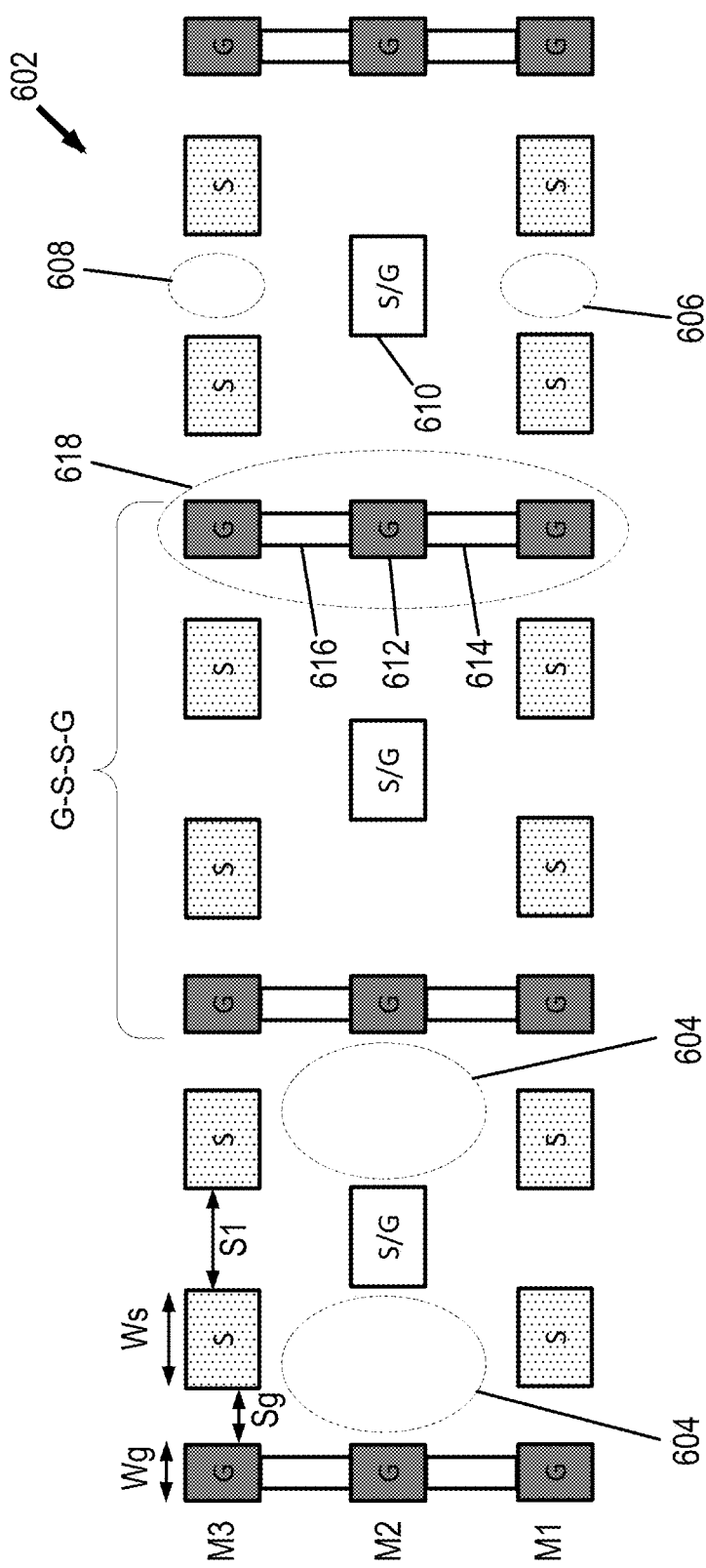
FIG. 6 illustrates a modified interposer topology, in accordance with various embodiments of the present disclosure.

As previously noted, it has been discovered that an interposer, having a modified interposer topology as compared to various existing designs, may be employed for the heterogeneous integration of high-speed (e.g., HBM) and high-density (e.g., FPGAs and/or SOCs) components, without the drawbacks of at least some current solutions. For example, by optimizing the interposer topology, and by creating virtual dielectric gaps between signal lines, embodiments of the present disclosure provide for the reduction of resistance (R) and capacitance (C) simultaneously to meet both high-speed (e.g., HBM) and high-density (e.g., FPGAs and/or SOCs) interconnect requirements. With reference to FIG. 6, a system for providing an interposer having a modified interposer topology is described. In some embodiments, one or more aspects discussed above with reference to FIGS. 2, 3, 4, 5A, 5B, and 5C may also apply to the system for providing an interposer having a modified interposer topology, discussed below.

Referring now to FIG. 6, illustrated therein is an interposer topology 602, in accordance with various embodiments of the present disclosure. As shown, the interposer topology 602 provides an exemplary structure for an interposer interconnect network, such as for the interconnect networks 304, 306, 308 of the interposer 212, including three metal interconnect layers (M1, M2, M3). However, the disclosed interposer topology 602 may be similarly applied to four (M1, M2, M3, M4), five (M1, M2, M3, M4, M5), or more metal interconnect layers without departing from the scope of this disclosure. As shown in FIG. 6, the M1 and M3 interconnect layers of the interposer topology 602 may be used as signal routing layers, where adjacent interconnect lines within each of the M1 and M3 interconnect layers follow a repeated pattern of ground-signal-signal-ground (G-S-S-G). In various embodiments, M1 and M3 signal lines are vertically aligned with each other. The M2 interconnect layer, which is disposed between the M1 and M3 interconnect layers, may include signal 'S' or ground 'G' lines that interleave the M1 and M3 signal lines to provide "empty" spaces 604 (i.e., regions without an interconnect line but including a dielectric layer) between the M1 and M3 signal 'S' lines, and within the M2 interconnect layer, to create a virtual dielectric gap that has a high inter-metal dielectric thickness and provides for reduced capacitance. As a further result, the M2 signal 'S' or ground 'G' lines 610 may be disposed over (or at least partially over) an M1 interconnect layer empty space 606 and beneath (or at least partially beneath) an M3 interconnect layer empty space 608, where as noted above the empty spaces include regions without an interconnect line but including a dielectric layer. The M2 signal 'S' or ground 'G' lines 610 are denoted in FIG. 6 as 'S/G', as each of these interconnect lines may be employed as either a signal 'S' line or a ground 'G' line. Thus, for purposes of this discussion, the M2 signal 'S' or ground 'G' lines 610 may be referred to as "configurable signal/ground (S/G) lines". In various examples, and unlike the interposer topologies 502, 504, 506, where all signal 'S' interconnect lines have another metal line (e.g., either signal 'S' or ground 'G') beneath and/or over the signal 'S' interconnect lines, the interposer topology 602 instead provides "empty" spaces over and/or beneath signal 'S' interconnect lines to increase the inter-metal dielectric thickness and thereby reduce capacitance. Once again, while not explicitly shown, it is understood that one or more IMD layers may be used to electrically isolate the three metal interconnect layers (M1, M2, M3), as well as signal or ground lines within a given layer, from each other.

In further contrast to existing interposer topologies (e.g., the interposer topologies 502, 504, 506), and still with reference to the interposer topology 602, a signal line width Ws' of the M1 and M3 signal lines may be increased (e.g., as compared to conventional designs) to reduce resistance, but by providing the empty spaces 604 between the M1 and M3 signal 'S' lines, the inter-metal (e.g., M1 signal line to M3 signal line) dielectric thickness is increased and capacitance (and thus RC delay) is also reduced. For purposes of illustration, and in some embodiments, the signal line width Ws' of the interposer topology 602 may be equal to about 2 microns, a signal line spacing 'S1' may be equal to about 3 microns, a ground line width 'Wg' may be equal to about 0.4 microns, a signal-to-ground line spacing 'Sg' may be equal to about 1.3 microns, and an equivalent signal pitch may be equal to about 5 microns. In some examples, and to maintain adequate spacing between adjacent signal 'S' and ground 'G' lines, the ground line width 'Wg' may be decreased (e.g., as compared to conventional designs). Also, in some embodiments, the M2 signal 'S' or ground 'G' lines 610 may have similar dimensions (e.g., line width) as the signal line width Ws' of the M1 and M3 signal lines. In some cases, the ground line width 'Wg' may be substantially the same for each of the three metal interconnect layers M1, M2, M3. Alternatively, in some embodiments, the ground line width 'Wg' for the M2 interconnect layer may be larger than the ground line width 'Wg' for the M1 and M3 metal interconnect layers.

In some embodiments, and still referring to the interposer topology 602, at least some of the M2 ground 'G' lines (e.g., such as ground 'G' lines 612) may be disposed directly between M1 and M3 ground 'G' lines, where the M1, M2, and M3 ground 'G' lines are connected by VIAs 614, 616 to form stacked metal-VIA chains (GND-VIA chains 618) that provide a ground shield as a signal return path. Also, the M2 signal 'S' or ground 'G' lines 610 that are disposed over the M1 interconnect layer empty space 606 and beneath the M3 interconnect layer empty space 608 may be disposed between neighboring GND-VIA chains 618, as shown. Thus, in various embodiments, the interposer topology 602 provides a GND mesh within the M2 interconnect layer with periodic perpendicular straps connecting M1 and M3 GND lines (e.g., by the GND-VIA chains 618) to form an effective ground shield with low resistance. In some cases, periodic horizontal straps within the M2 interconnect layer (e.g., about every 50 microns) may also be provided to further build the GND mesh. It is also noted that the interposer topology 602 is shown as having a total of 12 signal 'S' interconnect lines for the illustrative portion of the interposer interconnect network shown. In contrast, conventional interposer topologies (e.g., the interposer topologies 502, 504, 506) may have only 6 signal 'S' interconnect lines (FIGS. 5A and 5B) or 10 signal 'S' interconnect lines (FIG. 5C) within a similarly sized portion of the interposer interconnect network as shown in the interposer topology 602 of FIG. 6. Thus, by employing the interposer topology 602 within an interposer such as the interposer 212 and in addition to various other advantages, the interposer 212 may be able to meet both high-speed (e.g., for HBM) and high-density (e.g., as in FPGAs and SOCs) interconnect requirements suitable for use in a heterogeneous device, such as the device 200 discussed above.

Figure 9:
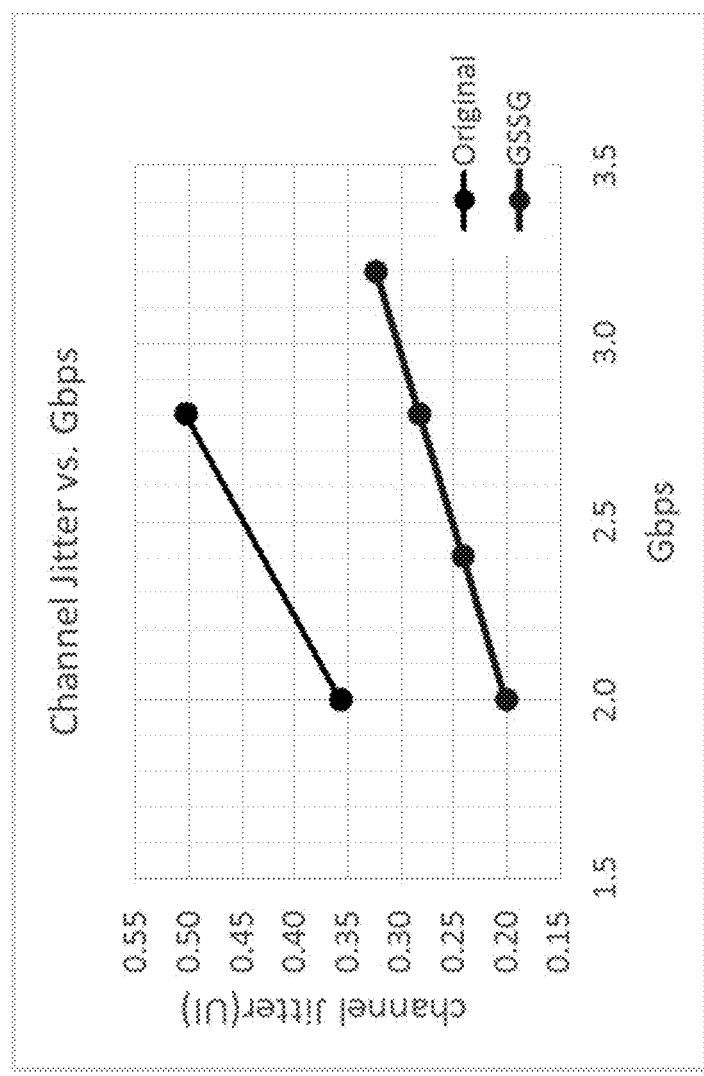
FIG. 9 provides a graph showing channel jitter (UI) as a function of speed (Gbps) for a conventional interposer topology and for the modified interposer topology of FIG. 6, according to some embodiments.

With reference now to FIG. 7, illustrated therein is an eye diagram simulation 702 for a modified interposer topology according to various embodiments of the present disclosure. Generally, eye diagrams are used to provide an indication of signal quality. Thus, for purposes of this discussion, the eye diagram simulation 702 provides an indication of signal quality within the modified interposer topology 602 of FIG. 6. In some embodiments, the eye diagram simulation 702 may be generated using an electromagnetic (EM)-based field solver circuit simulation. For the present example, the eye diagram simulation 702 spans a 500 ps time window (as shown on the X-axis of FIG. 7), and is performed at a speed of 2 Gbps. FIG. 8 provides a table 802 showing a summary of some of the key data extracted from the eye diagram simulation 702, labeled in the table 802 as 'GSSG'. In addition, and for purposes of comparison, the table 802 also provides data for an eye diagram simulation corresponding to a conventional interposer topology (e.g., such as the interposer topologies 502, 504, 506), labeled in the table 802 as 'Original'. As shown, the GSSG topology significantly improves the eye-width (e.g., eye-width (UI) increased from 0.643 to 0.799) and reduces channel jitter (e.g., channel jitter (UI) decreased from 0.357 to 0.201). In fact, the conventional interposer topology fails to meet the JEDEC jitter spec at 2 Gbps. Additionally, the GSSG topology reduces crosstalk by about 4× (e.g., from 0.382 to 0.099). In various examples, the GSSG topology disclosed herein may be extended to 2.8 Gbps applications. Moreover, the eye diagram simulation (e.g., the eye-width (UI)) has been shown to exceed the JEDEC spec for HBM (e.g., for HBM2) with the eye-width (UI) being greater than 0.8 UI at 2.8 Gbps performance on the system level. As a further illustration, FIG. 9 provides a graph 902 showing channel jitter (UI) as a function of speed (Gbps) for a conventional interposer topology ('Original') and for the modified interposer topology 602 of FIG. 6 ('GSSG'). As shown, the channel jitter (UI) for the conventional interposer topology is significantly greater than for the GSSG topology across the range of measured speeds (Gbps).

It is noted that various configurations (e.g., the exemplary interposer topologies including the number of metal interconnect layers and generally the metal planning/routing/sizing of the plurality of metal interconnect layers) illustrated in the figures are exemplary only and are not intended to be limiting beyond what is specifically recited in the claims that follow. In addition, it is noted that the modified interposer topology disclosed herein may be applied to any heterogeneous SiP integration, using either an interposer, an embedded multi-die interconnect bridge (EMIB), or other type of interconnect scheme, to meet both high-density routing and high-performance (high-speed) routing requirements. It will be understood by those skilled in that art in possession of this disclosure that other configurations may be used.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A die-to-die interconnect structure, comprising:
an interconnect network including a plurality of metal interconnect layers, wherein the interconnect network is configured to electrically couple a first die and a second die mounted on a top surface of the die-to-die interconnect structure;
wherein a first metal interconnect layer of the plurality of metal interconnect layers includes a first plurality of ground lines and a first plurality of signal lines, wherein the first plurality of ground and signal lines are distributed across the first metal interconnect layer according to a first pattern, and wherein the first plurality of signal lines includes a pair of immediately adjacent signal lines that are separated by a first dielectric region; and
wherein a second metal interconnect layer of the plurality of metal interconnect layers is disposed above the first metal interconnect layer and includes a plurality of configurable signal/ground lines, and wherein each of the plurality of configurable signal/ground lines is disposed over the first dielectric region that separates the pair of immediately adjacent signal lines within the first metal interconnect layer.

2. The die-to-die interconnect structure of claim 1,
wherein a third metal interconnect layer of the plurality of metal interconnect layers includes a second plurality of ground lines and a second plurality of signal lines, wherein the second plurality of ground and signal lines are distributed across the third metal interconnect layer according to the first pattern, and wherein adjacent signal lines within the third metal interconnect layer are separated by a second dielectric region.

3. The die-to-die interconnect structure of claim 2,
wherein the second metal interconnect layer of the plurality of metal interconnect layers is disposed below the third metal interconnect layer, and wherein each of the plurality of configurable signal/ground lines is disposed beneath the second dielectric region.

4. The die-to-die interconnect structure of claim 2,
wherein each signal line of the first plurality of signal lines of the first metal interconnect layer is substantially vertically aligned with respective ones of each signal line of the second plurality of signal lines of the third metal interconnect layer.

5. The die-to-die interconnect structure of claim 4,
wherein each signal line of the first plurality of signal lines of the first metal interconnect layer is separated from respective ones of each signal line of the second plurality of signal lines of the third metal interconnect layer by a third dielectric region.

6. The die-to-die interconnect structure of claim 5,
wherein at least a portion of the third dielectric region is disposed within the second metal interconnect layer.

7. The die-to-die interconnect structure of claim 2,
wherein the second metal interconnect layer of the plurality of metal interconnect layers further includes a third plurality of ground lines, wherein each of the third plurality of ground lines is disposed directly between a respective first ground line of the first plurality of ground lines and a respective second ground line of the second plurality of ground lines.

8. The die-to-die interconnect structure of claim 7,
wherein each of the third plurality of ground lines is coupled to the respective first ground line of the first plurality of ground lines using a first VIA, and wherein each of the third plurality of ground lines is coupled to the respective second ground line of the second plurality of ground lines using a second VIA to form a plurality of stacked ground-VIA chains; and
wherein each of the plurality of configurable signal/ground lines is disposed between adjacent stacked ground-VIA chains.

9. The die-to-die interconnect structure of claim 1,
wherein the first pattern includes a ground-signal-signal-ground (G-S-S-G) pattern.

10. The die-to-die interconnect structure of claim 1,
wherein each signal line of the first plurality of signal lines has a signal line width equal to about 2 microns, and wherein adjacent signal lines within the first metal interconnect layer are separated by a signal line spacing equal to about 3 microns.

11. The die-to-die interconnect structure of claim 1,
wherein the die-to-die interconnect structure includes a passive silicon interposer or an embedded multi-die interconnect bridge (EMIB).

12. The die-to-die interconnect structure of claim 1,
wherein the first die includes a field programmable gate array (FPGA) die or a system-on-a-chip (SoC) die, and wherein the second die includes a high-bandwidth memory (HBM).

13. A heterogeneous device, comprising:
a die-to-die interconnect structure including an interconnect network having a plurality of metal interconnect layers; and
a first die and a second die coupled to a plurality of microbumps disposed on a top surface of the die-to-die interconnect structure, wherein the plurality of microbumps electrically couple to the interconnect network to provide a connection between the first die and the second die;
wherein a first metal interconnect layer of the plurality of metal interconnect layers includes a first plurality of ground lines and a first plurality of signal lines distributed across the first metal interconnect layer according to a ground-signal-signal-ground (G-S-S-G) pattern, and wherein adjacent signal lines within the first metal interconnect layer are separated by a first non-conductive region; and
wherein a second metal interconnect layer of the plurality of metal interconnect layers is disposed above the first metal interconnect layer and includes a plurality of configurable signal/ground lines, and wherein each of the plurality of configurable signal/ground lines is disposed over the first non-conductive region.

14. The heterogeneous device of claim 13,
wherein the die-to-die interconnect structure includes a passive silicon interposer or an embedded multi-die interconnect bridge (EMIB).

15. The heterogeneous device of claim 13,
wherein the first die includes a field programmable gate array (FPGA) die or a system-on-a-chip (SoC) die, and wherein the second die includes a high-bandwidth memory (HBM).

16. The heterogeneous device of claim 13,
wherein a third metal interconnect layer of the plurality of metal interconnect layers includes a second plurality of ground lines and a second plurality of signal lines distributed across the third metal interconnect layer according to the G-S-S-G pattern, and wherein adjacent signal lines within the third metal interconnect layer are separated by a second non-conductive region.

17. The heterogeneous device of claim 16,
wherein the second metal interconnect layer of the plurality of metal interconnect layers is disposed below the third metal interconnect layer, and wherein each of the plurality of configurable signal/ground lines is disposed beneath the second non-conductive region.

18. An interconnect structure configured to electrically couple a first die and a second die, comprising:
 a first interconnect layer including a first plurality of ground lines and a first plurality of signal lines arranged in a ground-signal-signal-ground (G-S-S-G) pattern;
 a third interconnect layer including a second plurality of ground lines and a second plurality of signal lines arranged in the G-S-S-G pattern; and
 a second interconnect layer disposed between the first and third interconnect layers, wherein the second interconnect layer includes a first plurality of dielectric regions, wherein each of the plurality of dielectric regions are substantially vertically aligned with, and electrically isolate, respective ones of the first plurality of signal lines and the second plurality of signal lines.

19. The interconnect structure of claim 18,
wherein adjacent signal lines within the first interconnect layer are separated by a second dielectric region; and
wherein adjacent signal lines within the third interconnect layer are separated by a third dielectric region.

20. The interconnect structure of claim 19,
wherein the second interconnect layer includes a configurable signal/ground line that is substantially vertically aligned with, and disposed between, the second dielectric region and the third dielectric region.

* * * * *